(12) United States Patent
Hosoya et al.

(10) Patent No.: US 11,721,461 B2
(45) Date of Patent: Aug. 8, 2023

(54) PARTICLES OF MAGNETOPLUMBITE-TYPE HEXAGONAL FERRITE, METHOD FOR MANUFACTURING THE SAME, AND RADIO WAVE ABSORBER

(71) Applicant: FUJIFILM Corporation, Tokyo (JP)

(72) Inventors: Yoichi Hosoya, Minami-Ashigara (JP); Masashi Shirata, Minami-Ashigara (JP); Tatsuo Mikami, Minami-Ashigara (JP)

(73) Assignee: FUJIFILM Corporation, Tokyo (JP)

( * ) Notice: Subject to any disclaimer, the term of this patent is extended or adjusted under 35 U.S.C. 154(b) by 218 days.

(21) Appl. No.: 16/904,932

(22) Filed: Jun. 18, 2020

(65) Prior Publication Data
US 2020/0335247 A1    Oct. 22, 2020

Related U.S. Application Data

(63) Continuation of application No. PCT/JP2018/047650, filed on Dec. 25, 2018.

(30) Foreign Application Priority Data

Dec. 27, 2017   (JP) ................. 2017-252035

(51) Int. Cl.
| | |
|---|---|
| *H01F 1/34* | (2006.01) |
| *H01F 1/37* | (2006.01) |
| *C01G 49/00* | (2006.01) |
| *H05K 9/00* | (2006.01) |
| *C30B 29/22* | (2006.01) |

(52) U.S. Cl.
CPC ......... *H01F 1/348* (2013.01); *C01G 49/0045* (2013.01); *C30B 29/22* (2013.01); *H05K 9/0075* (2013.01); *C01P 2002/76* (2013.01); *C01P 2006/42* (2013.01)

(58) Field of Classification Search
CPC ... H01F 1/348; H01F 1/34; H01F 1/37; H01F 1/11; C01G 49/00; C01G 49/0045; H05K 9/0075; H01Q 17/00; C01P 2006/42
See application file for complete search history.

(56) References Cited

FOREIGN PATENT DOCUMENTS

| | | |
|---|---|---|
| CN | 102010194 A | 4/2011 |
| DE | 37 29 693 A1 | 5/1988 |
| JP | 52-106048 U | 8/1977 |

(Continued)

OTHER PUBLICATIONS

Torkian et al., "Structural and Magnetic Properties of High Coercive Al-Substituted Strontium Hexaferrite Nanoparticles", Feb. 15, 2016, J. Supercond Nov Magn 29, pp. 1627-1640. (Year: 2016).*

(Continued)

*Primary Examiner* — Matthew E. Hoban
*Assistant Examiner* — Lynne Edmondson
(74) *Attorney, Agent, or Firm* — Sughrue Mion, PLLC

(57) ABSTRACT

To provide magnetoplumbite-type hexagonal ferrite particles represented by Formula (1) and having a single crystal phase, and the application. In Formula (1), A represents at least one metal element selected from the group consisting of Sr, Ba, Ca, and Pb, and x satisfies $1.5 \leq x \leq 8.0$.

$$AFe_{(12-x)}Al_xO_{19} \quad \text{Formula (1)}$$

7 Claims, 2 Drawing Sheets

(56) References Cited

FOREIGN PATENT DOCUMENTS

| JP | 64-000707 | A | | 1/1989 |
|---|---|---|---|---|
| JP | 7-193388 | A | | 7/1995 |
| JP | 11354972 | A | * | 12/1999 |
| JP | 2006-351693 | A | | 12/2006 |
| JP | 2007-250823 | A | | 9/2007 |
| JP | 2007250823 | A | * | 9/2007 |
| JP | 4674380 | B2 | | 4/2011 |

OTHER PUBLICATIONS

Machine translation of JPH11354972A, 10 pages. (Year: 1999).*
Machine translation of JP2007-250823, 12 pages. (Year: 2007).*
Communication dated Apr. 27, 2021, issued by the Japanese Patent Office in application No. 2019-562050.
Communication dated Jun. 8, 2021 in the Japanese Application No. 2019-562050.
H Y He et al., "Magnetic and microwave-absorbing properties of $SrAl_4Fe_8O_{19}$ powders synthesized by coprecipitation and citric-combustion methods", Bull. Mater. Sci., Jun. 2011, vol. 34, No. 3, pp. 463-468 (6 pages total).
H. Luo et al., "Physical and magnetic properties of highly aluminum doped strontium ferrite nanoparticles prepared by auto-combustion route", Journal of Magnetism and Magnetic Materials, 2012, vol. 324, pp. 2602-2608 (7 pages total).
Extended European Search Report dated Dec. 15, 2020 in European Application No. 18894941.6.
Communication dated Dec. 7, 2021 from the Japanese Patent Office in Application No. 2019-562050.
Office Action dated Oct. 9, 2021, issued in Chinese Application No. 201880083676.8.
Communication dated May 6, 2021 from The State Intellectual Property Office of P.R. of China in Machine Application No. 201880083676.8.
Office Action dated Jun. 1, 2021 in Korean Application No. 10-2020-7016654.
International Search Report dated Mar. 12, 2019 in International Application No. PCT/JP2018/047650.
Written Opinion of the International Searching Authority dated Mar. 12, 2019 in International Application No. PCT/JP2018/047650.
International Preliminary Report on Patentability dated Jun. 30, 2020 in International Application No. PCT/JP2018/047650.
Communication dated Sep. 1, 2021 from the European Patent Office in EP application No. 18894941.6.
Office Action dated Jul. 5, 2022 from the Japanese Patent Office in JP Application No. 2019-562050.
Office Action dated Apr. 21, 2022 issued by the Chinese Patent Office in Chinese Application No. 201880083676.8.
Office Action dated Feb. 22, 2023 from the European Patent Office in EP Application No. 18894941.6.
Office Action dated May 18, 2023, issued in Chinese Application No. 201880083676.8.

* cited by examiner

PARTICLES OF MAGNETOPLUMBITE-TYPE HEXAGONAL FERRITE, METHOD FOR MANUFACTURING THE SAME, AND RADIO WAVE ABSORBER

CROSS-REFERENCE TO RELATED APPLICATION

This application is a continuation application of International Application No. PCT/JP2018/047650, filed Dec. 25, 2018, the disclosure of which is incorporated herein by reference in its entirety. Further, this application claims priority from Japanese Patent Application No. 2017-252035, filed Dec. 27, 2017, the disclosure of which is incorporated herein by reference in its entirety.

BACKGROUND OF THE INVENTION

1. Field of the Invention

The present disclosure relates to particles of a magnetoplumbite-type hexagonal ferrite, a method for producing the same, and a radio wave absorber.

2. Description of the Related Art

In recent years, along with the diversification of the use of radio waves in high frequency bands, such as electronic toll collection systems (ETC), advanced cruise-assist highway systems (AHS), and satellite broadcasting, malfunctions and failures of electronic devices due to radio wave interference have been problems. In order to reduce the influence of such radio wave interference on electronic devices, a radio wave absorber absorbs unnecessary radio waves to prevent the reflection of the radio waves.

As a radio wave absorber, a radio wave absorber using a magnetic material is often used. A radio wave incident to the radio wave absorber including a magnetic material generates a magnetic field in the magnetic material. In a case where the generated magnetic field is reduced to radio wave energy, part of the energy is lost and absorbed. Accordingly, in the radio wave absorber including the magnetic material, a frequency band in which the effect is obtained differs depending on the type of the magnetic material used.

For example, JP4674380B discloses a magnetic powder for a radio wave absorber in which a peak particle size of laser diffraction scattering particle size distribution is 10 μm or more in a magnetoplumbite-type hexagonal ferrite powder represented by a composition formula $AFe_{(12-x)}Al_xO_{19}$, in which A is one or more of Sr, Ba, Ca, and Pb, and x is 1.0 to 2.2. According to the magnetic powder for a radio wave absorber disclosed in JP4674380B, excellent radio wave absorption performance is exhibited near 76 GHz.

SUMMARY OF THE INVENTION

With the rapid development of information and communication technologies in recent years, the usage of radio waves in the high frequency band is expected to become increasingly diversified in the future. Therefore, from a viewpoint of coping with radio waves with various frequencies, development of a radio wave absorber capable of exhibiting excellent radio wave absorption performance in a higher frequency band is desired.

The inventors have conducted intensive studies on a magnetic material suitable for a radio wave absorber, and found that, in particles of a magnetoplumbite-type hexagonal ferrite in which a part of iron was substituted with aluminum, by increasing a ratio of aluminum atoms to iron atoms, radio waves in higher frequency bands can be absorbed. However, the inventors have conducted further studies and found that, in the particles of a magnetoplumbite-type hexagonal ferrite, as the ratio of the aluminum atoms increased, the radio waves that could be absorbed shifted to a higher frequency band, and the radio wave absorption performance tended to decrease.

An object of one embodiment of the invention is to provide particles of a magnetoplumbite-type hexagonal ferrite having excellent magnetic properties and capable of exhibiting excellent radio wave absorption performance even in a high frequency band.

In addition, an object of another embodiment of the invention is to provide a method for producing particles of a magnetoplumbite-type hexagonal ferrite having excellent magnetic properties and capable of exhibiting excellent radio wave absorption performance even in a high frequency band.

Furthermore, an object of still another embodiment of the invention is to provide a radio wave absorber capable of exhibiting excellent radio wave absorption performance even in a high frequency band.

Means for achieving the objects include the following aspects.

<1> Particles of a magnetoplumbite-type hexagonal ferrite represented by Formula (1) and having a single crystal phase.

$$AFe_{(12-x)}Al_xO_{19} \qquad \text{Formula (1)}$$

In Formula (1), A represents at least one metal element selected from the group consisting of Sr, Ba, Ca, and Pb, and x satisfies 1.5≤x≤8.0.

<2> The particles of a magnetoplumbite-type hexagonal ferrite according to <1>, in which x in Formula (1) satisfies 1.5≤x≤6.0.

<3> The particles of a magnetoplumbite-type hexagonal ferrite according to <1> or <2>, in which the magnetoplumbite-type hexagonal ferrite particles are used for a radio wave absorber.

<4> A method for producing the particles of a magnetoplumbite-type hexagonal ferrite according to any one of <1> to <3>, the method including:

a step A of obtaining a precipitate containing Fe, Al, and the at least one metal element selected from the group consisting of Sr, Ba, Ca, and Pb by a liquid phase method; and A step B of firing the precipitate obtained in the step A.

<5> The method for producing the particles of a magnetoplumbite-type hexagonal ferrite according to <4>, in which the step A includes a step of mixing an aqueous solution containing an Fe salt, an Al salt, and a salt of the at least one metal element with an alkali aqueous solution to obtain a reaction product.

<6> A radio wave absorber having a planar shape, including: the particles of a magnetoplumbite-type hexagonal ferrite according to any one of <1> to <3>; and a binder.

<7> A radio wave absorber having a three-dimensional shape, including: the particles of a magnetoplumbite-type hexagonal ferrite according to any one of <1> to <3>; and a binder.

According to one embodiment of the invention, there is provided particles of a magnetoplumbite-type hexagonal ferrite having excellent magnetic properties and capable of exhibiting excellent radio wave absorption performance even in a high frequency band.

In addition, according to another embodiment of the invention, there is provided a method for producing particles of a magnetoplumbite-type hexagonal ferrite having excellent magnetic properties and capable of exhibiting excellent radio wave absorption performance even in a high frequency band.

Further, according to still another embodiment of the invention, there is provided a radio wave absorber capable of exhibiting excellent radio wave absorption performance even in a high frequency band.

DESCRIPTION OF THE PREFERRED EMBODIMENTS

Figure 1:
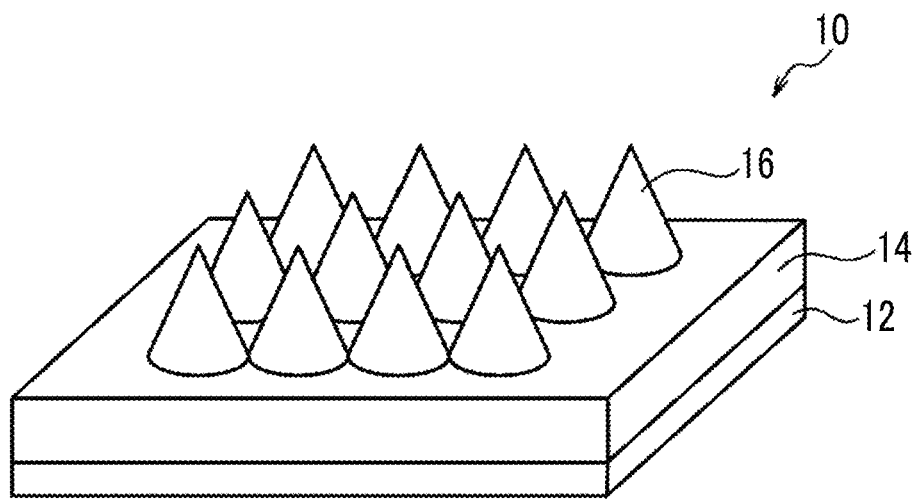
FIG. 1 is a perspective view of a radio wave absorber of Example 6B.

Hereinafter, an example of an embodiment of particles of a magnetoplumbite-type hexagonal ferrite to which the invention is applied will be described. Here, the invention is not limited to the embodiments hereinafter, and modifications can be suitably added within the range of the object of the invention.

A range of numerical values shown using "to" in the disclosure means a range including numerical values before and after "to" as a minimum value and a maximum value.

In the range of numerical values disclosed in stepwise in the disclosure, an upper limit value and a lower limit value disclosed in a certain range of numerical values may be replaced with an upper limit value and a lower limit value disclosed in another range of numerical values disclosed in stepwise. In addition, in the range of numerical values disclosed in the disclosure, an upper limit value and a lower limit value disclosed in a certain range of numerical values may be replaced with values shown in examples.

In the disclosure, a combination of two or more preferred aspects is a more preferred aspect.

In the disclosure, in a case where plural kinds of substances corresponding to each component are present, an amount of each component means the amount of all of the plural kinds of substances, unless otherwise noted.

In the disclosure, a term "step" does not only mean an individual step, but also include a case a step cannot be clearly differentiated from another step, in a case where the desired object of the step is achieved.

Particles of Magnetoplumbite-Type Hexagonal Ferrite

The particles of a magnetoplumbite-type hexagonal ferrite of the disclosure (hereinafter, also referred to as "magnetoplumbite-type hexagonal ferrite particles") are represented by Formula (1) and have a single crystal phase.

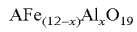

$$AFe_{(12-x)}Al_xO_{19} \quad \text{Formula (1)}$$

In Formula (1), A represents at least one metal element selected from the group consisting of Sr, Ba, Ca, and Pb, and x satisfies $1.5 \leq x \leq 8.0$.

As described above, with the rapid development of information and communication technologies in recent years, from a viewpoint of coping with radio waves with various frequencies, development of a radio wave absorber capable of exhibiting excellent radio wave absorption performance in a higher frequency band is desired.

The inventors have conducted intensive studies on particles of a magnetoplumbite-type hexagonal ferrite in which a part of iron was substituted with aluminum, as the magnetic material suitable for a radio wave absorber, and found that, by increasing a ratio of aluminum atoms to iron atoms, radio waves in higher frequency bands can be absorbed. However, it was found that, as the ratio of the aluminum atoms increased, the radio waves that could be absorbed shifted to a higher frequency band, and the radio wave absorption performance tended to decrease. The inventors have conducted further studies and found that, in a case where a crystal phase of the magnetoplumbite-type hexagonal ferrite is a single crystal phase, excellent magnetic properties were obtained and excellent radio wave absorption performance was obtained even in a high frequency band.

That is, the magnetoplumbite-type hexagonal ferrite particles of the disclosure are represented by Formula (1) and have a single crystal phase, and thus excellent magnetic properties are obtained and excellent radio wave absorption performance can be obtained even in a high frequency band.

According to the magnetoplumbite-type hexagonal ferrite particles of the disclosure, for example, by controlling the ratio of aluminum atoms, it is possible to design the absorption wavelength of the radio wave of the radio wave absorber, and to efficiently increase the absorption of the radio wave at a desired frequency.

In contrast to the magnetoplumbite-type hexagonal ferrite particles of the disclosure, with particles of a magnetoplumbite-type hexagonal ferrite whose crystal phase is not a single phase (for example, the crystal phase is two-phase), it is difficult to exhibit excellent radio wave absorption performance, even in a case where the ratio of the aluminum atoms is high (for example, see Comparative Examples 1B and 2B which will be described later).

Meanwhile, in the related art, the particles of a magnetoplumbite-type hexagonal ferrite have been produced by a method of obtaining the particles by firing a plurality of solid raw materials, which is a so-called solid-phase method. In this solid-phase method, aluminum atoms hardly enters the crystal after firing, and accordingly, in a case where a large amount of aluminum material is used, the crystal phase is less likely to become a single phase (for example, see Comparative Examples 3A and 4A which will be described later).

For example, the powder of a magnetoplumbite-type hexagonal ferrite disclosed in JP4674380B is produced by a solid-phase method. According to the confirmation of the inventors, it is determined that, in the powder of a magnetoplumbite-type hexagonal ferrite disclosed in JP4674380B, in a case where the ratio of aluminum atoms is increased, the crystal phase becomes two phases, and the radio wave absorption performance is deteriorated.

The magnetoplumbite-type hexagonal ferrite particles of the disclosure can be obtained by a liquid phase method. According to the liquid phase method, unlike the solid-phase method of the related art, aluminum atoms are likely to enter the crystal, and it is considered that a single-phase crystal phase can be obtained even in a case where a large amount of aluminum raw material is used.

The surmise described above does not limitedly interpret the magnetoplumbite-type hexagonal ferrite particles of the disclosure and is described as an example.

The magnetoplumbite-type hexagonal ferrite particles of the disclosure are particles of a compound represented by Formula (1).

Regarding A in Formula (1), the kind or number of metal elements are not particularly limited as long as A is at least one metal element selected from the group consisting of Sr, Ba, Ca, and Pb.

For example, from a viewpoint of operability and handleability, A in Formula (1) is preferably at least one metal element selected from the group consisting of Sr, Ba, and Ca.

x in Formula (1) satisfies $1.5 \leq x \leq 8.0$, preferably satisfies $1.5 \leq x \leq 6.0$, and more preferably satisfies $2.0 \leq x \leq 6.0$.

In a case where x in Formula (1) is 1.5 or more, radio waves in a frequency band higher than 60 GHz can be absorbed.

In a case where x in Formula (1) is 8.0 or less, the magnetoplumbite-type hexagonal ferrite particles have magnetism.

Specific examples of the magnetoplumbite-type hexagonal ferrite represented by Formula (1) include $SrFe_{(9.58)}Al_{(2.42)}O_{19}$, $SrFe_{(9.37)}Al_{(2.63)}O_{19}$, $SrFe_{(9.27)}Al_{(2.73)}O_{19}$, $SrFe_{(9.85)}Al_{(2.15)}O_{19}$, $SrFe_{(10.00)}Al_{(2.00)}O_{19}$, $SrFe_{(9.74)}Al_{(2.26)}O_{19}$, $SrFe_{(10.44)}Al_{(1.56)}O_{19}$, $SrFe_{(9.79)}Al_{(2.21)}O_{19}$, $SrFe_{(9.33)}Al_{(2.67)}O_{19}$, $SrFe_{(7.88)}Al_{(4.12)}O_{19}$, $SrFe_{(7.04)}Al_{(4.96)}O_{19}$, $SrFe_{(7.37)}Al_{(4.63)}O_{19}$, $SrFe_{(6.25)}Al_{(5.75)}O_{19}$, $SrFe_{(7.71)}Al_{(4.29)}O_{19}$, $Sr_{(0.80)}Ba_{(0.10)}Ca_{(0.10)}Fe_{(9.83)}Al_{(2.17)}O_{19}$, $BaFe_{(9.50)}Al_{(2.50)}O_{19}$, $CaFe_{(10.00)}Al_{(2.00)}O_{19}$, and $PbFe_{(9.00)}Al_{(3.00)}O_{19}$.

The composition of the magnetoplumbite-type hexagonal ferrite particles is confirmed by high frequency inductively coupled plasma (ICP) emission spectroscopy.

Specifically, a pressure-resistant container containing 12 mg of sample particles and 10 mL of a 4 mol/L (liter; the same applies hereinafter) hydrochloric acid aqueous solution is held in an oven at a set temperature of 120° C. for 12 hours to obtain a solution. Next, 30 mL of pure water is added to the obtained solution, which is then filtered using a 0.1 μm membrane filter. Elemental analysis of the filtrate obtained as described above is performed using a high frequency inductively coupled plasma (ICP) emission spectrometer. Based on the obtained elemental analysis results, a content of each metal atom with respect to 100 atom % of iron atoms is obtained. The composition is confirmed based on the obtained content.

As the measurement device, for example, a high frequency inductively coupled plasma (ICP) emission spectrometer (model number: ICPS-8100) manufactured by Shimadzu Corporation can be suitably used. However, the measurement device is not limited to this.

The magnetoplumbite-type hexagonal ferrite particles of the disclosure are particles of a magnetoplumbite-type hexagonal ferrite having a single crystal phase.

In the disclosure, the expression "the crystal phase is a single phase" indicates that only one kind of diffraction pattern showing a crystal structure of magnetoplumbite-type hexagonal ferrite having any composition is observed in powder X-ray diffraction (XRD) measurement. In other words, there is no such a case where a plurality of magnetoplumbite-type hexagonal ferrites of any composition are mixed, and two or more kinds of diffraction patterns are observed or diffraction patterns of crystal other than the magnetoplumbite-type hexagonal ferrite are observed. For the attribute of the diffraction pattern, for example, a database of the International Center for Diffraction Data (ICDD: registered trademark) can be referred to. For example, for the diffraction pattern of the magnetoplumbite-type hexagonal ferrite containing Sr, "00-033-1340" of the International Center for Diffraction Data (ICDD) can be referred to. However, in a case where a part of iron is substituted with aluminum, the peak position shifts.

The confirmation that the crystal phase of the magnetoplumbite-type hexagonal ferrite is a single phase can be performed by, for example, an X-ray diffraction (XRD) method.

Specifically, a method of performing the measurement by using a powder X-ray diffractometer under the following conditions is used.

As the measurement device, for example, an X'Pert Pro diffractometer manufactured by PANalytical can be suitably used. However, the measurement device is not limited to this.

Conditions

X-ray source: CuKα ray
[Wavelength: 1.54 Å (0.154 nm), output: 40 mA, 45 kV]
Scan range: $20° < 2\theta < 70°$
Scan interval: 0.05°
Scan speed: 0.75°/min The shape of the magnetoplumbite-type hexagonal ferrite particles of the disclosure is not particularly limited, and examples thereof include a plate shape and an irregular shape.

A number average particle diameter D50 of the magnetoplumbite-type hexagonal ferrite of the disclosure is not particularly limited, and is, for example, 2 μm or more and 100 μm or less.

The number average particle diameter D50 can be measured using, for example, a particle size distribution meter.

As the measurement device, for example, a laser diffraction/scattering type particle size distribution measurement device #LA-960 (model number) manufactured by Horiba, Ltd. can be suitably used. However, the measurement device is not limited to this.

A coercivity (Hc) of the magnetoplumbite-type hexagonal ferrite particles of the disclosure is preferably 400 kA/m or more, more preferably 500 kA/m or more, and even more preferably 600 kA/m or more.

In a case where the coercivity (Hc) of the magnetoplumbite-type hexagonal ferrite particles of the disclosure is 400 kA/m or more, excellent radio wave absorption performance tends to be exhibited even in a high frequency band.

The upper limit of the coercivity (Hc) of the magnetoplumbite-type hexagonal ferrite particles of the disclosure is not particularly limited, and for example, is preferably 1,500 kA/m or less.

A saturation magnetization (δs) per unit mass of the magnetoplumbite-type hexagonal ferrite particles of the disclosure is preferably 10 $Am^2$/kg or more, more preferably 20 $Am^2$/kg or more, and even more preferably 30 $Am^2$/kg or more.

In a case where the saturation magnetization (δs) per unit mass of the magnetoplumbite-type hexagonal ferrite particles of the disclosure is 10 $Am^2$/kg or more, the radio wave absorption performance tends to be more excellent.

The upper limit of the saturation magnetization (δs) per unit mass of the magnetoplumbite-type hexagonal ferrite particles of the disclosure is not particularly limited, and is preferably, for example, 60 $Am^2$/kg or less.

The coercivity (Hc) and saturation magnetization (δs) per unit mass of the magnetoplumbite-type hexagonal ferrite particles are values measured using a vibrating sample magnetometer under an environment of an ambient temperature of 23° C. and conditions of a maximum applied magnetic field of 3,589 kA/m and a magnetic field sweep speed of 1.994 kA/m/s.

As the measurement device, for example, a vibrating sample magnetometer (model number: TM-TRVSM5050-SMSL) manufactured by Tamagawa Manufacturing Co., Ltd. can be suitably used. However, the measurement device is not limited to this.

Uses of Magnetoplumbite-Type Hexagonal Ferrite Particles

The magnetoplumbite-type hexagonal ferrite particles of the disclosure are suitably used for a radio wave absorber, since magnetic properties are excellent and excellent radio wave absorption performance can be exhibited even in a high frequency band.

In the magnetoplumbite-type hexagonal ferrite particles of the disclosure, as the ratio of aluminum atoms is increased, radio waves that can be absorbed shift to higher frequency bands, and excellent radio wave absorption performance can be exhibited in the high frequency band. Therefore, in a case where the magnetoplumbite-type hexagonal ferrite particles of the disclosure are used for a radio wave absorber, the range of selection of applicable frequencies in a high frequency band is widened.

Method for Producing Magnetoplumbite-Type Hexagonal Ferrite Particles

The magnetoplumbite-type hexagonal ferrite particles of the disclosure can be produced by a method including a step A of obtaining a precipitate containing Fe, Al, and at least one metal element selected from the group consisting of Sr, Ba, Ca, and Pb (hereinafter, also referred to as a "specific metal element") by a liquid phase method, and a step B of firing the precipitate obtained in step A.

The step A and the step B may each be divided into two or more stages.

Hereinafter, each step will be described in detail.

<Step A>

The step A is a step of obtaining a precipitate containing Fe, Al, and at least one metal element selected from the group consisting of Sr, Ba, Ca, and Pb (that is, specific metal element) by a liquid phase method.

In the step A, a precipitate of a reaction product serving as a precursor of the magnetoplumbite-type hexagonal ferrite particles can be obtained. It is surmised that the precipitate obtained in the step A is an iron hydroxide, an aluminum hydroxide, or a composite hydroxide of iron, aluminum, and the specific metal element.

The step A preferably includes a step of mixing an aqueous solution containing an Fe salt, an Al salt, and a salt of the specific metal element (hereinafter, also referred to as a "raw material aqueous solution") with an alkali aqueous solution to obtain a reaction product (hereinafter, referred to as "Step A1").

In the step A1, an aqueous solution containing a reaction product serving as a precursor of the magnetoplumbite-type hexagonal ferrite particles (so-called precursor-containing aqueous solution) can be obtained.

In addition, the step A preferably includes a step of performing solid-liquid separation of the reaction product obtained in step A1 (hereinafter, also referred to as "step A2").

In the step A2, a precipitate of a reaction product serving as a precursor of the magnetoplumbite-type hexagonal ferrite particles (that is, the precipitate in step A) can be obtained.

(Step A1)

The step A1 is a step of mixing an aqueous solution (that is, raw material aqueous solution) containing an Fe salt, an Al salt, and a salt of the specific metal element with an alkali aqueous solution to obtain a reaction product.

The salt of the Fe salt, the Al salt, and the salt of the specific metal element is not particularly limited, and for example, from viewpoints of availability and cost, water-soluble inorganic acid salts such as nitrates, sulfates, and chlorides are preferable.

Specific examples of the Fe salt include iron (III) chloride hexahydrate [$FeCl_3 \cdot 6H_2O$] and iron (III) nitrate nonahydrate [$Fe(NO_3)_3 \cdot 9H_2O$].

Specific examples of the Al salt include an aluminum chloride hexahydrate [$AlCl_3 \cdot 6H_2O$] and an aluminum nitrate nonahydrate [$Al(NO_3)_3 \cdot 9H_2O$].

Specific examples of the Sr salt include a strontium chloride hexahydrate [$SrCl_2 \cdot 6H_2O$], a strontium nitrate [$Sr(NO_3)_2$], and a 0.5 strontium acetate hemihydrate [$Sr(CH_3COO)_2 \cdot 0.5H_2O$].

Specific examples of the Ba salt include a barium chloride dihydrate [$BaCl_2 \cdot 2H_2O$], a barium nitrate [$Ba(NO_3)_2$], and a barium acetate [$(CH_3COO)_2Ba$].

Specific examples of the Ca salt include a calcium chloride dihydrate [$CaCl_2 \cdot 2H_2O$], a calcium nitrate tetrahydrate [$Ca(NO_3)_2 \cdot 4H_2O$], and a calcium acetate monohydrate [$(CH_3COO)_2Ca \cdot H_2O$].

Specific examples of the Pb salt include lead (II) chloride [$PbCl_2$] and lead (II) nitrate [$Pb(NO_3)_2$].

The alkali aqueous solution is not particularly limited, and examples thereof include a sodium hydroxide aqueous solution and a potassium hydroxide aqueous solution.

A concentration of the alkali aqueous solution is not particularly limited, and may be, for example, 0.1 mol/L to 10 mol/L.

The raw material aqueous solution and the alkali aqueous solution may be simply mixed with each other. The raw material aqueous solution and the alkali aqueous solution may be mixed in their entirety at once, or the raw material aqueous solution and the alkali aqueous solution may be gradually mixed little by little. Alternatively, the mixture may be added to one of the raw material aqueous solution and the alkali aqueous solution while the other is added little by little.

For example, from a viewpoint of reproducibility of the radio wave absorption performance, it is preferable that the raw material aqueous solution and the alkali aqueous solution are gradually mixed little by little.

The method of mixing the raw material aqueous solution and the alkali aqueous solution is not particularly limited, and examples thereof include a method of mixing by stirring.

Stirring means are not particularly limited, and a general stirring tool or a stirring device can be used.

The stirring time is not particularly limited as long as the reaction of the components to be mixed is completed, and can be appropriately set according to the composition of the raw material aqueous solution, the type of the stirring tool or the stirring device, and the like.

The temperature at which the raw material aqueous solution and the alkali aqueous solution are mixed is, for example, preferably 100° C. or lower from a viewpoint of preventing bumping, and more preferably 95° C. or lower and even more preferably 15° C. to 92° C. from a viewpoint of obtaining a good reaction product.

Means for adjusting the temperature is not particularly limited, and a general heating device, cooling device, or the like can be used.

The pH at 25° C. of the aqueous solution obtained by mixing the raw material aqueous solution and the alkali aqueous solution is, for example, preferably from 5 to 13 and more preferably from 6 to 12, from a viewpoint of more easily obtaining a precipitate.

(Step A2)

Step A2 is a step of performing solid-liquid separation of the reaction product obtained in step A1.

The method of performing solid-liquid separation is not particularly limited, and examples thereof include decantation, centrifugal separation, and filtration (suction filtration, pressure filtration, and the like).

In a case where the solid-liquid separation method is centrifugal separation, the conditions for centrifugal separation are not particularly limited, and for example, centrifugal separation is preferably performed at a rotation speed of 2,000 revolutions per minute (rpm; the same applies hereinafter) for 3 minutes to 30 minutes. The centrifugal separation may be performed a plurality of times.

<Step B>

Step B is a step of firing the precipitate obtained in step A.

In step B, the precipitate obtained in step A is fired to obtain the magnetoplumbite-type hexagonal ferrite particles of the disclosure.

The Firing can be performed using a heating device.

The heating device is not particularly limited as long as it can heat to a target temperature, and any well-known heating device can be used. As the heating device, for example, in addition to an electric furnace, a firing device uniquely manufactured according to a production line can be used.

The firing is preferably performed in the atmosphere.

The firing temperature is not particularly limited, and is, for example, preferably 900° C. or higher, more preferably 900° C. to 1,400° C., and even more preferably 1,000° C. to 1,200° C.

The firing time is not particularly limited, and is, for example, preferably 1 hour to 10 hours and more preferably 2 hours to 6 hours.

The precipitate obtained in step A is preferably dried before firing, for example, from a viewpoint of reproducibility of radio wave absorption performance.

The drying means is not particularly limited, and examples thereof include a dryer such as an oven.

The drying temperature is not particularly limited, and is, for example, preferably 50° C. to 200° C. and more preferably from 70° C. to 150° C.

The drying time is not particularly limited, and for example, is preferably 2 hours to 50 hours and more preferably 5 hours to 30 hours.

Radio Wave Absorber

The radio wave absorber of the disclosure includes the magnetoplumbite-type hexagonal ferrite particles of the disclosure (hereinafter, also referred to as "specific magnetoplumbite-type hexagonal ferrite particles") and a binder.

Since the radio wave absorber of the disclosure includes the specific magnetoplumbite-type hexagonal ferrite particles, excellent radio wave absorption performance can be exhibited even in a high frequency band.

In the radio wave absorber of the disclosure, for example, by controlling the ratio of aluminum atoms to iron atoms (that is, the value of x in Formula (1)) in the specific magnetoplumbite-type hexagonal ferrite particles, it is possible to design the absorption wavelength of radio waves of the radio wave absorber, and it is possible to efficiently increase the absorption of radio waves at a desired frequency.

The radio wave absorber of the disclosure may have a planar shape or a three-dimensional shape.

The planar shape thereof is not particularly limited, and examples thereof include a sheet shape and a film shape.

Figure 4:
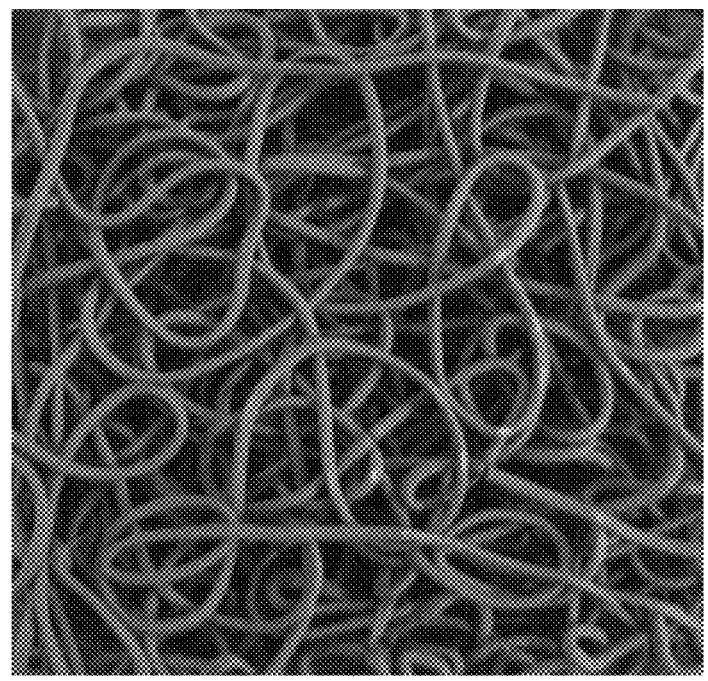
FIG. 4 is an optical image obtained by observing a radio wave absorber according to one embodiment of the invention in a normal direction.

The three-dimensional shape is not particularly limited, and examples thereof include a polygonal column having a shape of a triangle or more, a column, a pyramid, a cone, a honeycomb, and the like. In addition, a linear radio wave absorber as shown in FIG. 4 is also used as one aspect of the radio wave absorber having a three-dimensional shape.

In addition, as the three-dimensional shape, a shape obtained by combining the above-described planar shape and the three-dimensional shape is also used. One example is a combination of a radio wave absorber having a sheet-like planar shape and a radio wave absorber having a conical three-dimensional shape as shown in FIG. 1. The details of the radio wave absorber shown in FIG. 1 will be described later.

In the radio wave absorber of the disclosure, the radio wave absorption performance can be controlled not only by the content of the specific magnetoplumbite-type hexagonal ferrite particles but also by the shape of the radio wave absorber.

The radio wave absorber of the disclosure may include only one kind of the specific magnetoplumbite-type hexagonal ferrite particles, or may include two or more kinds thereof.

A content of the specific magnetoplumbite-type hexagonal ferrite particles in the radio wave absorber of the disclosure is not particularly limited, and is, for example, preferably equal to or greater than 10 mass %, more preferably equal to or greater than 30 mass %, and even more preferably equal to or greater than 50 mass % with respect to a total solid content of the radio wave absorber, from a viewpoint of ensuring excellent radio wave absorption properties.

In addition, a content of the specific magnetoplumbite-type hexagonal ferrite particles in the radio wave absorber of the disclosure is, for example, preferably equal to or less than 98 mass %, more preferably equal to or less than 95 mass %, and even more preferably equal to or less than 92 mass % with respect to a total solid content of the radio wave absorber, from viewpoints of manufacturing suitability and durability.

The radio wave absorber of the disclosure includes a binder.

In the disclosure, the term "binder" is a general term for a substance that can maintain the specific magnetoplumbite-type hexagonal ferrite particles in a dispersed state and form a form of a radio wave absorber.

The binder is not particularly limited, and examples thereof include a resin, a rubber, and a combination of a resin and a rubber.

The resin may be either a thermoplastic resin or a thermosetting resin.

Specific examples of the thermoplastic resin include an acrylic resin; polyacetal; polyamide; polyethylene; polypropylene; polyethylene terephthalate; polybutylene terephthalate; polycarbonate; polystyrene; polyphenylene sulfide; polypropylene; polyvinyl chloride; an acrylonitrile butadiene styrene (ABS) resin obtained by copolymerization of acrylonitrile, butadiene, and styrene; and an acrylonitrile styrene (AS) resin obtained by copolymerization of acrylonitrile and styrene.

Specific examples of the thermosetting resin include a phenol resin, an epoxy resin, a melamine resin, a urea resin, an unsaturated polyester, a diallyl phthalate resin, a urethane resin, and a silicon resin.

Rubber is preferable as the binder contained in the radio wave absorber of the disclosure.

The rubber is not particularly limited and, for example, preferable examples thereof include synthetic rubber such as butadiene rubber; isoprene rubber; chloroprene rubber; halogenated butyl rubber; fluoro rubber; urethane rubber; acrylic rubber (ACM) obtained by copolymerization of acrylates (for example, ethyl acrylate, butyl acrylate, and 2-ethylhexyl acrylate) and other monomers; ethylene-propylene rubber obtained by coordination polymerization of ethylene and propylene using a Ziegler catalyst; butyl rubber (IIR) obtained by copolymerization of isobutylene and isoprene; styrene butadiene rubber (SBR) obtained by copolymerization of butadiene and styrene; acrylonitrile-butadiene rubber (NBR) obtained by copolymerization of acrylonitrile and butadiene; silicone rubber, from viewpoints that mixability with specific magnetoplumbite-type hexagonal ferrite particles is good and the radio wave absorber having more excellent durability, weather resistance, and impact resistance can be formed.

Examples of the combination of the resin and the rubber include a thermoplastic elastomer (TPE).

Specific examples of a thermoplastic elastomer include an olefin-based thermoplastic elastomer (TPO), a styrene-based thermoplastic elastomer (TPS), an amide-based thermoplastic elastomer (TPA), and a polyester-based thermoplastic elastomer (TPC).

In a case where the radio wave absorber of the disclosure contains rubber as the binder, it may contain various additives such as a vulcanizing agent, a vulcanization aid, a softener, and a plasticizer, in addition to the rubber.

Examples of the vulcanizing agent include sulfur, an organic sulfur compound, and a metal oxide.

The radio wave absorber of the disclosure may include only one kind of binder and may include two or more kinds thereof.

A content of the binder in the radio wave absorber of the disclosure is not particularly limited, and is, for example, preferably equal to or greater than 2 mass %, more preferably equal to or greater than 5 mass %, and even more preferably equal to or greater than 8 mass % with respect to a total solid content of the radio wave absorber, from a viewpoint of dispersibility of the specific magnetoplumbite-type hexagonal ferrite particles and viewpoints of manufacturing suitability and durability of the radio wave absorber.

In addition, the content of the binder in the radio wave absorber is, for example, preferably equal to or smaller than 90 mass %, more preferably equal to or smaller than 70 mass %, and even more preferably equal to or smaller than 50 mass %, with respect to a total solid content of the radio wave absorber, from a viewpoint of ensuring excellent radio wave absorption properties.

The radio wave absorber of the disclosure may include various additives (so-called other additives) as necessary, in addition to the specific magnetoplumbite-type hexagonal ferrite particles and the binder, as long as the effects of the embodiment do not impaired.

Examples of other additives include a dispersing agent, a dispersing aid, an antibacterial agent, an antistatic agent, and an antioxidant. One component of the other additives may perform more than two functions.

The fact that the radio wave absorber contains the specific magnetoplumbite-type hexagonal ferrite particles can be confirmed, for example, by the following method.

After the radio wave absorber is finely chopped, it is immersed in a solvent (for example, acetone) for 1 or 2 days, and then dried. The structure can be confirmed by further finely grinding the dried radio wave absorber and performing X-ray powder diffraction (XRD) measurement. After cutting out the cross section of the radio wave absorber, the composition can be confirmed by using, for example, an energy dispersive X-ray analyzer.

The method for producing the radio wave absorber of the disclosure is not particularly limited.

The radio wave absorber of the disclosure can be produced by a well-known method using the specific magnetoplumbite-type hexagonal ferrite particles, the binder, a solvent, and, as necessary, other components.

For example, a radio wave absorber formation composition containing the specific magnetoplumbite-type hexagonal ferrite particles, the binder, a solvent, and, as necessary, other components, is applied over a support and dried. Thereby, a radio wave absorber having a planar shape can be produced.

In addition, for example, a radio wave absorber formation composition containing the specific magnetoplumbite-type hexagonal ferrite particles, the binder, a solvent, and, as necessary, other components, is ejected over a support using a nozzle and dried. Thereby, a radio wave absorber having a three-dimensional shape can be produced.

The solvent is not particularly limited and examples thereof include, for example, water, an organic solvent, or a mixed solvent of water and an organic solvent.

The organic solvent is not particularly limited, and examples thereof include alcohols such as methanol, ethanol, n-propanol, i-propanol, or methoxypropanol, ketones such as acetone, methyl ethyl ketone, or cyclohexane, tetrahydrofuran, acetonitrile, ethyl acetate, and toluene.

Among these, as the solvent, at least one kind selected from methyl ethyl ketone and cyclohexane is preferable, from viewpoints of a comparatively low boiling point and ease of drying.

The contents of the specific magnetoplumbite-type hexagonal ferrite particles and the binder in the radio wave absorber formation composition may be adjusted respectively so that the contents of the specific magnetoplumbite-type hexagonal ferrite particles and the binder in the finally obtained radio wave absorber become the contents of the specific magnetoplumbite-type hexagonal ferrite particles and the binder in the radio wave absorber described above.

A content of the solvent in the radio wave absorber formation composition is not particularly limited, and is suitably selected, for example, in accordance with the kind or amount of the component blended in the radio wave absorber formation composition.

In the radio wave absorber formation composition, the specific magnetoplumbite-type hexagonal ferrite particles and the binder may be simply mixed.

The method of mixing the specific magnetoplumbite-type hexagonal ferrite particles and the binder is not particularly limited, and examples thereof include a method of mixing by stirring.

Stirring means are not particularly limited, and a general stirring device can be used.

As the stirring device, a mixer such as a paddle mixer or an impeller mixer is used.

The stirring time is not particularly limited, and for example, can be suitably set in accordance with the kind of the stirring device or the composition of the radio wave absorber formation composition.

The support is not particularly limited, and a well-known support can be used.

Examples of the material configuring the support include a metal plate (plate of metal such as aluminum, zinc, or copper), a plastic sheet [sheet of polyester (polyethylene terephthalate, polyethylene naphthalate, or polybutylene terephthalate), polyethylene (linear low-density polyethylene, low-density polyethylene, or high-density polyethylene), polypropylene, polystyrene, polycarbonate, polyimide, polyamide, polyamide imide, polysulfone, polyvinyl chloride, polyacrylonitrile, polyphenylene sulfide, polyether imide, polyether sulfone, polyvinyl acetal, or an acrylic resin], a plastic sheet on which metal described above is laminated or vapor-deposited.

The support can function to maintain the form of the formed radio wave absorber. In a case where the formed radio wave absorber can maintain its own form, a peeling film may be used as the support and may be removed from the radio wave absorber after formation of the radio wave absorber.

The shape, the structure, or the size of the support can be suitably selected according to the purpose.

The shape of the support is, for example, a flat plate shape.

The structure of the support may be a single-layered structure or a laminated structure of two or more layers.

A size of the support can be suitably selected according to the size of the radio wave absorber and the like.

The thickness of the support is not particularly limited, and is normally approximately 0.01 mm to 10 mm, for example, preferably 0.02 mm to 3 mm and more preferably 0.05 mm to 1 mm, from a viewpoint of handleability.

The method for applying the radio wave absorber formation composition on a support is not particularly limited, and examples thereof include methods using a die coater, a knife coater, an applicator, and the like.

The method for drying the radio wave absorber formation composition applied or ejected onto the support is not particularly limited, and examples thereof include a method using a heating device such as an oven.

The drying temperature and drying time are not particularly limited as long as the solvent in the radio wave absorber formation composition can be volatilized. As an example, the drying can be performed by heating at 30° C. to 150° C. for 0.01 to 2 hours.

In addition, for example, while heating the radio wave absorber formation composition including the specific magnetoplumbite-type hexagonal ferrite particles, the binder, and, as necessary, other components and mixing using a kneader, a mixture is obtained, and the obtained mixture is subjected to molding (processing by extrusion molding, injection molding, in-mold molding, or the like) into a planar shape (for example, a sheet shape) or a three-dimensional shape, so that radio wave absorber having a desired shape is produced.

EXAMPLES

Hereinafter, the invention will be described in detail with reference to examples, but the invention is not limited to the following examples, within a range not departing the gist thereof.

Producing of Hexagonal Ferrite Particles

Example 1A

A total amount of a raw material aqueous solution prepared by dissolving 57.0 g of iron (III) chloride hexahydrate [$FeCl_3 \cdot 6H_2O$], 27.8 g of strontium chloride hexahydrate [$SrCl_2 \cdot 6H_2O$], and 10.7 g of aluminum chloride hexahydrate [$AlCl_3 \cdot 6H_2O$] in 216.0 g of water, and a total amount of a solution prepared by adding 113.0 g of water to 181.3 g of 5 mol/L sodium hydroxide aqueous solution were added to 400.0 g of water kept at 35° C. and stirred, respectively, at a flow rate of 10 mL/min and the same timing, to obtain a first solution.

Next, after changing the temperature of the first solution to 25° C., 39.8 g of a 1 mol/L sodium hydroxide aqueous solution was added to obtain a second solution. The pH of the second solution was 10.5. The pH of the second solution was measured using a desktop pH meter #F-71 (product name) manufactured by Horiba, Ltd. (the same applies hereinafter).

Next, the second solution was stirred for 15 minutes to complete the reaction, and an aqueous solution containing a reaction product to be a precursor of hexagonal ferrite particles (that is, a precursor-containing aqueous solution) was obtained.

Next, the precursor-containing aqueous solution was subjected to centrifugal separation (rotation speed: 3,000 rpm, rotation time: 10 minutes) three times, and the resulting precipitate was collected.

Next, the collected precipitate was washed with water.

Next, the precipitate after washing with water was dried in an oven at an internal atmosphere temperature of 80° C. for 12 hours to obtain particles formed of the precursor (that is, precursor particles).

Next, the precursor particles were put in a muffle furnace, and the temperature in the furnace was set to a temperature condition of 1,060° C. in the atmosphere, followed by firing for 4 hours, thereby hexagonal ferrite particles of Example 1A (hereinafter, also referred to as "particles 1") were obtained.

Example 2A

Except that a precursor-containing aqueous solution was obtained as described below, the same operation as in Example 1A was performed to obtain hexagonal ferrite particles of Example 2A (hereinafter, also referred to as "particles 2").

A total amount of a raw material aqueous solution prepared by dissolving 57.0 g of iron (III) chloride hexahydrate [$FeCl_3 \cdot 6H_2O$], 27.8 g of strontium chloride hexahydrate [$SrCl_2 \cdot 6H_2O$], and 11.5 g of aluminum chloride hexahydrate [$AlCl_3 \cdot 6H_2O$] in 215.5 g of water, and a total amount of a solution prepared by adding 111.0 g of water to 183.6 g of 5 mol/L sodium hydroxide aqueous solution were added to 400.0 g of water kept at 35° C. and stirred, respectively, at a flow rate of 10 mL/min and the same timing, to obtain a first solution.

Next, after changing the temperature of the first solution to 25° C., 39.8 g of a 1 mol/L sodium hydroxide aqueous solution was added to obtain a second solution. The pH of the second solution was 10.5.

Next, the second solution was stirred for 15 minutes to complete the reaction, and an aqueous solution containing a reaction product to be a precursor of hexagonal ferrite particles (that is, a precursor-containing aqueous solution) was obtained.

Example 3A

Except that a precursor-containing aqueous solution was obtained as described below, the same operation as in Example 1A was performed to obtain hexagonal ferrite particles of Example 3A (hereinafter, also referred to as "particles 3").

A total amount of a raw material aqueous solution prepared by dissolving 57.0 g of iron (III) chloride hexahydrate [$FeCl_3 \cdot 6H_2O$], 27.8 g of strontium chloride hexahydrate [$SrCl_2 \cdot 6H_2O$], and 12.2 g of aluminum chloride hexahydrate [$AlCl_3 \cdot 6H_2O$] in 215.2 g of water, and a total amount of a solution prepared by adding 109.0 g of water to 185.7 g of 5 mol/L sodium hydroxide aqueous solution were added to 400.0 g of water kept at 35° C. and stirred, respectively, at a flow rate of 10 mL/min and the same timing, to obtain a first solution.

Next, after changing the temperature of the first solution to 25° C., 39.8 g of a 1 mol/L sodium hydroxide aqueous solution was added to obtain a second solution. The pH of the second solution was 10.5.

Next, the second solution was stirred for 15 minutes to complete the reaction, and an aqueous solution containing a reaction product to be a precursor of hexagonal ferrite particles (that is, a precursor-containing aqueous solution) was obtained.

Example 4A

Except that a precursor-containing aqueous solution was obtained as described below, the same operation as in Example 1A was performed to obtain hexagonal ferrite particles of Example 4A (hereinafter, also referred to as "particles 4").

A total amount of a raw material aqueous solution prepared by dissolving 57.0 g of iron (III) chloride hexahydrate [$FeCl_3 \cdot 6H_2O$], 27.8 g of strontium chloride hexahydrate [$SrCl_2 \cdot 6H_2O$], and 9.43 g of aluminum chloride hexahydrate [$AlCl_3 \cdot 6H_2O$] in 216.0 g of water, and a total amount of a solution prepared by adding 115.4 g of water to 178.3 g of 5 mol/L sodium hydroxide aqueous solution were added to 400.0 g of water kept at 35° C. and stirred, respectively, at a flow rate of 10 mL/min and the same timing, to obtain a first solution.

Next, after changing the temperature of the first solution to 25° C., 39.8 g of a 1 mol/L sodium hydroxide aqueous solution was added to obtain a second solution. The pH of the second solution was 10.5.

Next, the second solution was stirred for 15 minutes to complete the reaction, and an aqueous solution containing a reaction product to be a precursor of hexagonal ferrite particles (that is, a precursor-containing aqueous solution) was obtained.

Example 5A

Except that a precursor-containing aqueous solution was obtained as described below, the same operation as in Example 1A was performed to obtain hexagonal ferrite particles of Example 5A (hereinafter, also referred to as "particles 5").

A total amount of a raw material aqueous solution prepared by dissolving 57.0 g of iron (III) chloride hexahydrate [$FeCl_3 \cdot 6H_2O$], 27.8 g of strontium chloride hexahydrate [$SrCl_2 \cdot 6H_2O$], and 8.87 g of aluminum chloride hexahydrate [$AlCl_3 \cdot 6H_2O$] in 216.0 g of water, and a total amount of a solution prepared by adding 116.5 g of water to 177.0 g of 5 mol/L sodium hydroxide aqueous solution were added to 400.0 g of water kept at 35° C. and stirred, respectively, at a flow rate of 10 mL/min and the same timing, to obtain a first solution.

Next, after changing the temperature of the first solution to 25° C., 39.8 g of a 1 mol/L sodium hydroxide aqueous solution was added to obtain a second solution. The pH of the second solution was 10.5.

Next, the second solution was stirred for 15 minutes to complete the reaction, and an aqueous solution containing a reaction product to be a precursor of hexagonal ferrite particles (that is, a precursor-containing aqueous solution) was obtained.

Example 6A

Except that a precursor-containing aqueous solution was obtained as described below, the same operation as in Example 1A was performed to obtain hexagonal ferrite particles of Example 6A (hereinafter, also referred to as "particles 6").

A total amount of a raw material aqueous solution prepared by dissolving 57.0 g of iron (III) chloride hexahydrate [$FeCl_3 \cdot 6H_2O$], 27.8 g of strontium chloride hexahydrate [$SrCl_2 \cdot 6H_2O$], and 10.0 g of aluminum chloride hexahydrate [$AlCl_3 \cdot 6H_2O$] in 216.0 g of water, and a total amount of a solution prepared by adding 114.0 g of water to 179.8 g of 5 mol/L sodium hydroxide aqueous solution were added to 400.0 g of water kept at 35° C. and stirred, respectively, at a flow rate of 10 mL/min and the same timing, to obtain a first solution.

Next, after changing the temperature of the first solution to 25° C., 39.8 g of a 1 mol/L sodium hydroxide aqueous solution was added to obtain a second solution. The pH of the second solution was 10.5.

Next, the second solution was stirred for 15 minutes to complete the reaction, and an aqueous solution containing a reaction product to be a precursor of hexagonal ferrite particles (that is, a precursor-containing aqueous solution) was obtained.

Example 7A

Except that a precursor-containing aqueous solution was obtained as described below, the same operation as in Example 1A was performed to obtain hexagonal ferrite particles of Example 7A (hereinafter, also referred to as "particles 7").

A total amount of a raw material aqueous solution prepared by dissolving 57.0 g of iron (III) chloride hexahydrate [$FeCl_3 \cdot 6H_2O$], 22.3 g of strontium chloride hexahydrate [$SrCl_2 \cdot 6H_2O$], 2.6 g of barium chloride dihydrate [$BaCl_2 \cdot 2H_2O$], 1.5 g of calcium chloride dihydrate [$CaCl_2 \cdot 2H_2O$], and 10.2 g of aluminum chloride hexahydrate [$AlCl_3 \cdot 6H_2O$] in 216.0 g of water, and a total amount of a solution prepared by adding 112.7 g of water to 181.5 g of 5 mol/L sodium hydroxide aqueous solution were added to 400.0 g of water kept at 35° C. and stirred, respectively, at a flow rate of 10 mL/min and the same timing, to obtain a first solution.

Next, after changing the temperature of the first solution to 25° C., 39.8 g of a 1 mol/L sodium hydroxide aqueous solution was added to obtain a second solution. The pH of the second solution was 10.5.

Next, the second solution was stirred for 15 minutes to complete the reaction, and an aqueous solution containing a reaction product to be a precursor of hexagonal ferrite particles (that is, a precursor-containing aqueous solution) was obtained.

Example 8A

A solution prepared by adding 600.0 g of water to 181.5 g of a 5 mol/L sodium hydroxide aqueous solution was kept at 92° C. and stirred.

A raw material aqueous solution prepared by dissolving 57.0 g of iron (III) chloride hexahydrate [$FeCl_3 \cdot 6H_2O$], 27.8 g of strontium chloride hexahydrate [$SrCl_2 \cdot 6H_2O$], and 10.7 g of aluminum chloride hexahydrate [$AlCl_3 \cdot 6H_2O$] in 216.0 g of water was added to the solution being stirred, at a flow rate of 3.3 mL/min, to obtain a first solution.

Next, the temperature of the first solution was changed to 25° C. The pH of the first solution (liquid temperature: 25° C.) was 8.0.

Next, the first solution was stirred for 15 minutes to complete the reaction, and an aqueous solution containing a reaction product to be a precursor of hexagonal ferrite particles (that is, a precursor-containing aqueous solution) was obtained.

Next, the precursor-containing aqueous solution was subjected to centrifugal separation (rotation speed: 3,000 rpm, rotation time: 10 minutes) three times, and the resulting precipitate was collected.

Next, the collected precipitate was washed with water.

Next, the precipitate after washing with water was dried in an oven at an internal atmosphere temperature of 80° C. for 12 hours. To the particles obtained by drying, strontium chloride that is 10% by mass with respect to the particles was added and mixed well to obtain particles formed of a precursor (that is, precursor particles).

Next, the precursor particles were put in a muffle furnace, and the temperature in the furnace was set to a temperature condition of 1,060° C. in the atmosphere, followed by firing for 4 hours, thereby hexagonal ferrite particles of Example 8A (hereinafter, also referred to as "particles 8") were obtained.

Example 9A

Except that a precursor-containing aqueous solution was obtained as described below, the same operation as in Example 8A was performed to obtain hexagonal ferrite particles of Example 9A (hereinafter, also referred to as "particles 9").

A solution prepared by adding 563.0 g of water to 189.0 g of a 5 mol/L sodium hydroxide aqueous solution was kept at 92° C. and stirred.

A raw material aqueous solution prepared by dissolving 57.0 g of iron (III) chloride hexahydrate [$FeCl_3 \cdot 6H_2O$], 27.8 g of strontium chloride hexahydrate [$SrCl_2 \cdot 6H_2O$], and 12.8 g of aluminum chloride hexahydrate [$AlCl_3 \cdot 6H_2O$] in 215.0 g of water was added to the solution being stirred, at a flow rate of 3.3 mL/min, to obtain a first solution.

Next, the temperature of the first solution was changed to 25° C. The pH of the first solution (liquid temperature: 25° C.) was 8.0.

Next, the first solution was stirred for 15 minutes to complete the reaction, and an aqueous solution containing a reaction product to be a precursor of hexagonal ferrite particles (that is, a precursor-containing aqueous solution) was obtained.

Example 10A

Except that a precursor-containing aqueous solution was obtained as described below, the same operation as in Example 1A was performed to obtain hexagonal ferrite particles of Example 10A (hereinafter, also referred to as "particles 10").

A solution prepared by adding 540.0 g of water to 4.4 g of a 1 mol/L sodium hydroxide aqueous solution was kept at 92° C. and stirred.

A total amount of a raw material aqueous solution prepared by dissolving 7.6 g of iron (III) chloride hexahydrate [$FeCl_3 \cdot 6H_2O$], 3.7 g of strontium chloride hexahydrate [$SrCl_2 \cdot 6H_2O$], and 4.8 g of aluminum chloride hexahydrate [$AlCl_3 \cdot 6H_2O$] in 166.0 g of water, and a total amount of a solution prepared by adding 14.5 g of water to 169.0 g of 1 mol/L sodium hydroxide aqueous solution were added to the solution being stirred, respectively, at a flow rate of 2.2 mL/min and the same timing, to obtain a first solution.

Next, the temperature of the first solution was changed to 25° C. The pH of the first solution (liquid temperature: 25° C.) was 11.5.

Next, the first solution was stirred for 15 minutes to complete the reaction, and an aqueous solution containing a reaction product to be a precursor of hexagonal ferrite particles (that is, a precursor-containing aqueous solution) was obtained.

Example 11A

Except that a precursor-containing aqueous solution was obtained as described below, the same operation as in Example 1A was performed to obtain hexagonal ferrite particles of Example 11A (hereinafter, also referred to as "particles 11").

A solution prepared by adding 540.0 g of water to 4.4 g of a 1 mol/L sodium hydroxide aqueous solution was kept at 92° C. and stirred.

A total amount of a raw material aqueous solution prepared by dissolving 7.6 g of iron (III) chloride hexahydrate [$FeCl_3 \cdot 6H_2O$], 3.7 g of strontium chloride hexahydrate [$SrCl_2 \cdot 6H_2O$], and 6.0 g of aluminum chloride hexahydrate [$AlCl_3 \cdot 6H_2O$] in 165.0 g of water, and a total amount of 184.5 g of 1 mol/L sodium hydroxide aqueous solution were added to the solution being stirred, respectively, at a flow rate of 2.2 mL/min and the same timing, to obtain a first solution.

Next, the temperature of the first solution was changed to 25° C. The pH of the first solution (liquid temperature: 25° C.) was 11.5.

Next, the first solution was stirred for 15 minutes to complete the reaction, and an aqueous solution containing a reaction product to be a precursor of hexagonal ferrite particles (that is, a precursor-containing aqueous solution) was obtained.

Example 12A

Except that a precursor-containing aqueous solution was obtained as described below, the same operation as in Example 1A was performed to obtain hexagonal ferrite particles of Example 12A (hereinafter, also referred to as "particles 12").

A solution prepared by adding 540.0 g of water to 4.4 g of a 1 mol/L sodium hydroxide aqueous solution was kept at 92° C. and stirred.

A total amount of a raw material aqueous solution prepared by dissolving 7.6 g of iron (III) chloride hexahydrate [$FeCl_3 \cdot 6H_2O$], 3.7 g of strontium chloride hexahydrate [$SrCl_2 \cdot 6H_2O$], and 7.2 g of aluminum chloride hexahydrate [$AlCl_3 \cdot 6H_2O$] in 178.0 g of water, and a total amount of 197.0 g of 1 mol/L sodium hydroxide aqueous solution were added to the solution being stirred, respectively, at a flow rate of 2.2 mL/min and the same timing, to obtain a first solution.

Next, the temperature of the first solution was changed to 25° C. The pH of the first solution (liquid temperature: 25° C.) was 11.5.

Next, the first solution was stirred for 15 minutes to complete the reaction, and an aqueous solution containing a reaction product to be a precursor of hexagonal ferrite particles (that is, a precursor-containing aqueous solution) was obtained.

Example 13A

Except that a precursor-containing aqueous solution was obtained as described below, the same operation as in Example 1A was performed to obtain hexagonal ferrite particles of Example 13A (hereinafter, also referred to as "particles 13").

A solution prepared by adding 540.0 g of water to 4.4 g of a 1 mol/L sodium hydroxide aqueous solution was kept at 92° C. and stirred.

A total amount of a raw material aqueous solution prepared by dissolving 38.0 g of iron (III) chloride hexahydrate [$FeCl_3 \cdot 6H_2O$], 18.5 g of strontium chloride hexahydrate [$SrCl_2 \cdot 6H_2O$], and 22.5 g of aluminum chloride hexahydrate [$AlCl_3 \cdot 6H_2O$] in 137.2 g of water, and a total amount of a solution prepared by adding 18.4 g of water to 187.8 g of 5 mol/L sodium hydroxide aqueous solution were added to the solution being stirred, respectively, at a flow rate of 2.2 mL/min and the same timing, to obtain a first solution.

Next, the temperature of the first solution was changed to 25° C. The pH of the first solution (liquid temperature: 25° C.) was 11.5.

Next, the first solution was stirred for 15 minutes to complete the reaction, and an aqueous solution containing a reaction product to be a precursor of hexagonal ferrite particles (that is, a precursor-containing aqueous solution) was obtained.

Example 14A

In the preparation of the precursor-containing aqueous solution, except that the solution prepared by adding 540.0 g of water to 4.4 g of a 1 mol/L sodium hydroxide aqueous solution was kept at "25° C." instead of keeping it at "92° C.", the same operation as in Example 13A was performed to obtain hexagonal ferrite particles of Example 14A (hereinafter, also referred to as "particles 14").

Example 15A

Except that a precursor-containing aqueous solution was obtained as described below, the same operation as in Example 1A was performed to obtain hexagonal ferrite particles of Example 15A (hereinafter, also referred to as "particles 15").

A raw material aqueous solution was prepared by dissolving 38.0 g of iron (III) chloride hexahydrate [$FeCl_3 \cdot 6H_2O$], 18.5 g of strontium chloride hexahydrate [$SrCl_2 \cdot 6H_2O$], and 22.5 g of aluminum chloride hexahydrate [$AlCl_3 \cdot 6H_2O$] in 137.2 g of water.

Next, a total amount of the raw material aqueous solution was rapidly added to a solution prepared by adding 558.4 g of water to 188.7 g of 5 mol/L sodium hydroxide aqueous solution, to obtain an aqueous solution containing a reaction product to be a precursor of hexagonal ferrite particles (that is, precursor-containing aqueous solution). The pH of the precursor-containing aqueous solution (liquid temperature: 25° C.) was 11.5.

Comparative Example 1A 1.00 part by mass of strontium carbonate [$SrCO_3$], 5.98 parts by mass of α-iron (III) oxide [$\alpha\text{-}Fe_2O_3$], 0.34 parts by mass of aluminum oxide [$Al_2O_3$], and 0.20 parts by mass of barium chloride [$BaCl_2$] were sufficiently mixed to obtain a raw material mixture.

Next, the raw material mixture was put in a muffle furnace, and the temperature in the furnace was set to a temperature condition of 1,250° C. in the atmosphere, followed by firing for 4 hours, thereby hexagonal ferrite particles of Comparative Example 1A (hereinafter, also referred to as "particles 16") were obtained.

Comparative Example 2A

Except that a raw material mixture was obtained as described below, the same operation as in Comparative Example 1A was performed to obtain hexagonal ferrite particles of Example 2A (hereinafter, also referred to as "particles 17").

1.00 part by mass of strontium carbonate [$SrCO_3$], 5.73 parts by mass of α-iron (III) oxide [$\alpha\text{-}Fe_2O_3$], 0.49 parts by mass of aluminum oxide [$Al_2O_3$], and 0.20 parts by mass of barium chloride [$BaCl_2$] were sufficiently mixed to obtain a raw material mixture.

Comparative Example 3A

Except that a raw material mixture was obtained as described below, the same operation as in Comparative Example 1A was performed to obtain hexagonal ferrite particles of Example 3A (hereinafter, also referred to as "particles 18").

1.00 part by mass of strontium carbonate [$SrCO_3$], 5.45 parts by mass of α-iron (III) oxide [$\alpha\text{-}Fe_2O_3$], 0.69 parts by mass of aluminum oxide [$Al_2O_3$], and 0.20 parts by mass of barium chloride [$BaCl_2$] were sufficiently mixed to obtain a raw material mixture.

Comparative Example 4A

Except that a raw material mixture was obtained as described below, the same operation as in Comparative Example 1A was performed to obtain hexagonal ferrite particles of Example 4A (hereinafter, also referred to as "particles 19").

1.00 part by mass of strontium carbonate [$SrCO_3$], 4.93 parts by mass of α-iron (III) oxide [$\alpha\text{-}Fe_2O_3$], 1.05 parts by mass of aluminum oxide [$Al_2O_3$], and 0.20 parts by mass of barium chloride [$BaCl_2$] were sufficiently mixed to obtain a raw material mixture.

Measurement

1. Crystal Structure

The crystal structures of the hexagonal ferrite particles (that is, the particles 1 to 19) of the Examples 1A to 15A and Comparative Examples 1A to 4A produced as described above were confirmed by an X-ray diffraction (XRD) method. Specifically, it was confirmed whether or not the magnetoplumbite-type crystal structure is obtained and whether the crystal structure had a single-phase or two-phase crystal structure.

An X'Pert Pro diffractometer manufactured by PANalytical was used as a device, and the measurement was performed under the following measurement conditions. The results are shown in Tables 1 to 6.

Measurement Conditions

X-ray source: CuKα ray
[Wavelength: 1.54 Å (0.154 nm), output: 40 mA, 45 kV]
Scan range: 20°<2θ<70°
Scan interval: 0.05°
Scan speed: 0.75°/min 2. Composition The composition of the hexagonal ferrite particles (that is, the particles 1 to 19) of the Examples 1A to 15A and Comparative Examples 1A to 4A produced as described above were confirmed by high frequency inductively coupled plasma (ICP) emission spectroscopy.

Specifically, a pressure-resistant container (beaker) containing 12 mg of each of particles and 10 mL of a 4 mol/L hydrochloric acid aqueous solution was held on a hot plate at a set temperature of 120° C. for 12 hours to obtain a solution. 30 mL of pure water was added to the obtained solution, which is then filtered using a 0.1 μm membrane filter. Elemental analysis of the filtrate obtained as described above was performed using a high frequency inductively coupled plasma (ICP) emission spectrometer (model number: ICPS-8100, Shimadzu Corporation).

Based on the obtained elemental analysis results, a content of each metal atom with respect to 100 atom % of iron atoms was obtained. Then, based on the obtained content, the composition of each of particles was confirmed. The composition of each of particles is shown below. Tables 1 to 6 show the ratio of aluminum atoms to iron atoms (that is, x value in Formula (1)).

Particle 1: $SrFe_{(9.58)}Al_{(2.42)}O_{19}$
Particle 2: $SrFe_{(9.37)}Al_{(2.63)}O_{19}$
Particle 3: $SrFe_{(9.27)}Al_{(2.73)}O_{19}$
Particle 4: $SrFe_{(9.85)}Al_{(2.15)}O_{19}$
Particle 5: $SrFe_{(10.00)}Al_{(2.00)}O_{19}$
Particle 6: $SrFe_{(9.74)}Al_{(2.26)}O_{19}$
Particle 7: $Sr_{(0.80)}Ba_{(0.10)}Ca_{(0.10)}Fe_{(9.83)}Al_{(2.17)}O_{19}$
Particle 8: $SrFe_{(10.44)}Al_{(1.56)}O_{19}$
Particle 9: $SrFe_{(9.79)}Al_{(2.21)}O_{19}$
Particle 10: $SrFe_{(9.33)}Al_{(2.67)}O_{19}$
Particle 11: $SrFe_{(7.88)}Al_{(4.12)}O_{19}$
Particle 12: $SrFe_{(7.04)}Al_{(4.96)}O_{19}$
Particle 13: $SrFe_{(7.37)}Al_{(4.63)}O_{19}$
Particle 14: $SrFe_{(6.25)}Al_{(5.75)}O_{19}$
Particle 15: $SrFe_{(7.70)}Al_{(4.29)}O_{19}$
Particle 16: $SrFe_{(11.08)}Al_{(0.92)}O_{19}$
Particle 17: $SrFe_{(10.62)}Al_{(1.38)}O_{19}$
Particle 18: $SrFe_{(10.06)}Al_{(1.94)}O_{19}$
Particle 19: $SrFe_{(8.80)}Al_{(3.19)}O_{19}$ 3. Magnetic Properties The coercivity (Hc) and the saturation magnetization (δs) of the hexagonal ferrite particles (that is, the particles 1 to 19) of the Examples 1A to 15A and Comparative Examples 1A to 4A produced as described above were confirmed as magnetic properties.

A vibrating sample magnetometer (model number: TM-TRVSM5050-SMSL, Tamagawa Seisakusho) was used as the device under an environment of an ambient temperature of 23° C. and under conditions of a maximum applied magnetic field of 3,589 kA/m, and a magnetic field sweep speed of 1.994 kA/m/s, and intensity of magnetization of the particles with respect to the applied magnetic field was measured. From the measurement results, a magnetic field (H)-magnetization (M) curve of each of particles was obtained. The coercivity (Hc) and saturation magnetization (δs) of each of particles were obtained based on the obtained magnetic field (H)-magnetization (M) curve. The results are shown in Tables 1 to 6.

TABLE 1

|  |  | Example 1A | Example 2A | Example 3A |
|---|---|---|---|---|
| Kind of particles |  | Particles 1 | Particles 2 | Particles 3 |
| Crystal structure (XRD) |  | Magnetoplumbite-type single crystal phase | Magnetoplumbite-type single crystal phase | Magnetoplumbite-type single crystal phase |
| Ratio of Al atoms (x value) |  | 2.42 | 2.63 | 2.73 |
| Magnetic properties | Coercivity (Hc) [kA/m] | 822.3 | 841.7 | 866.2 |
|  | Saturation magnetization (δs) [$Am^2/kg$] | 38.3 | 36.5 | 35.0 |

TABLE 2

|  | | Example 4A | Example 5A | Example 6A | Example 7A |
|---|---|---|---|---|---|
| Kind of particles | | Particles 4 | Particles 5 | Particles 6 | Particles 7 |
| Crystal structure (XRD) | | Magnetoplumbite-type single crystal phase | Magnetoplumbite-type single crystal phase | Magnetoplumbite-type single crystal phase | Magnetoplumbite-type single crystal phase |
| Ratio of Al atoms (x value) | | 2.15 | 2.00 | 2.26 | 2.17 |
| Magnetic properties | Coercivity (Hc) [kA/m] | 744.8 | 745.8 | 779.8 | 766.3 |
| | Saturation magnetization ($\delta s$) [Am$^2$/kg] | 42.2 | 44.4 | 36.0 | 33.9 |

TABLE 3

|  | | Example 8A | Example 9A |
|---|---|---|---|
| Kind of particles | | Particles 8 | Particles 9 |
| Crystal structure (XRD) | | Magnetoplumbite-type single crystal phase | Magnetoplumbite-type single crystal phase |
| Ratio of Al atoms (x value) | | 1.56 | 2.21 |
| Magnetic properties | Coercivity (Hc) [kA/m] | 581.4 | 783.5 |
| | Saturation magnetization ($\delta s$) [Am$^2$/kg] | 50.2 | 42.6 |

TABLE 4

|  | | Example 10A | Example 11A | Example 12A |
|---|---|---|---|---|
| Kind of particles | | Particles 10 | Particles 11 | Particles 12 |
| Crystal structure (XRD) | | Magnetoplumbite-type single crystal phase | Magnetoplumbite-type single crystal phase | Magnetoplumbite-type single crystal phase |
| Ratio of Al atoms (x value) | | 2.67 | 4.12 | 4.96 |
| Magnetic properties | Coercivity (Hc) [kA/m] | 795.8 | 1097.0 | 1205.0 |
| | Saturation magnetization ($\delta s$) [Am$^2$/kg] | 37.8 | 25.1 | 15.2 |

TABLE 5

|  | | Example 13A | Example 14A | Example 15A |
|---|---|---|---|---|
| Kind of particles | | Particles 13 | Particles 14 | Particles 15 |
| Crystal structure (XRD) | | Magnetoplumbite-type single crystal phase | Magnetoplumbite-type single crystal phase | Magnetoplumbite-type single crystal phase |
| Ratio of Al atoms (x value) | | 4.63 | 5.75 | 4.29 |
| Magnetic properties | Coercivity (Hc) [kA/m] | 1123.0 | 1280.0 | 966.6 |
| | Saturation magnetization ($\delta s$) [Am$^2$/kg] | 24.3 | 19.3 | 21.8 |

TABLE 6

|  | Comparative Example 2A | Comparative Example 3A | Comparative Example 4A |
|---|---|---|---|
| Kind of particles | Particles 16 | Particles 17 | Particles 18 | Particles 19 |
| Crystal structure (XRD) | Magnetoplumbite-type single crystal phase | Magnetoplumbite-type single crystal phase | Magnetoplumbite-type two phases | Magnetoplumbite-type two phases |

TABLE 6-continued

|  |  | Comparative Example 2A | Comparative Example 3A | Comparative Example 4A |
|---|---|---|---|---|
| Ratio of Al atoms (x value) |  | 0.92 | 1.38 | 1.94 | 3.19 |
| Magnetic properties | Coercivity (Hc) [kA/m] | 159.7 | 183.8 | 170.9 | 1844 |
|  | Saturation magnetization ($\delta$s) [Am²/kg] | 58.4 | 51.6 | 45.9 | 32.1 |

It was confirmed that the hexagonal ferrite particles of Examples 1A to 15A (that is, particles 1 to 15) obtained by the production method of the disclosure have a composition represented by Formula (1). In addition, it was confirmed that particles 1 to 15 were magnetoplumbite-type hexagonal ferrite particles having a single-phase crystal structure.

As shown in Tables 1 to 5, particles 1 to 15 were magnetoplumbite-type hexagonal ferrite particles having a single-phase crystal structure and having a content ratio of aluminum (Al) represented by x in Formula (1) of 1.5 or more, and high coercivity and excellent magnetic properties were obtained.

As shown in Table 6, it was confirmed that the hexagonal ferrite particles of Comparative Examples 1A and 2A (that is, particles 16 and 17) were magnetoplumbite-type hexagonal ferrite particles having a single-phase crystal structure and having a content ratio of aluminum (Al) represented by x in Formula (1) less than 1.5. Particles 16 and 17 showed significantly lower coercivity than particles 1 to 15.

As shown in Table 6, it was confirmed that the hexagonal ferrite particles of Comparative Examples 3A and 4A (that is, particles 18 and 19) were magnetoplumbite-type hexagonal ferrite particles having a two-phase crystal structure and having a content ratio of aluminum (Al) represented by x in Formula (1) of 1.5 or more. Particles 18 and 19 showed significantly lower coercivity than particles 1 to 15.

From the above results, in the production method of the related art which is a solid-phase method, it was found that, in a case where a large amount of aluminum oxide ($Al_2O_3$) is used as a raw material in order to increase the content ratio of aluminum (Al) in particles, the crystal phase became two phases. That is, in the production method of the related art, it was found that, magnetoplumbite-type hexagonal ferrite particles having a content ratio of aluminum (Al) represented by x in Formula (1) of 1.5 or more and a single crystal phase could not be obtained. In addition, it was found that, in a case where the crystal phase was two phases, a high coercivity was not exhibited even in a case where the content ratio of aluminum (Al) in the particles was high.

In contrast, according to the production method of the disclosure which is the liquid-phase method, it was found that the magnetoplumbite-type hexagonal ferrite particles having a single crystal phase and a high content ratio of aluminum (Al) in the particles were obtained. In addition, it was also found that magnetoplumbite-type hexagonal ferrite particles having a single crystal phase and a high content ratio of aluminum (Al) in the particles had high coercivity and excellent magnetic properties.

Production of Radio Wave Absorber (1)

Example 1B

A radio wave absorbing sheet as a radio wave absorber having a planar shape was produced by the following method.

9.0 g of the hexagonal ferrite particles of Example 1A (that is, particles 1), 1.05 g of acrylonitrile butadiene rubber (NBR) (grade: JSR N215SL, JSR Corporation, binder), and 6.1 g of cyclohexanone were stirred and mixed with a stirring device [Product name: Awatori Neritaro ARE-310, Shinky Co., Ltd.], at a rotation speed of 2,000 rpm for 5 minutes to prepare a radio wave absorbing layer formation composition. Next, the prepared radio wave absorbing layer formation composition was applied on a peeling film (product name: Panapeel (registered trademark) P75A, Panac Co., Ltd.) using an applicator to form a coating film. Next, the formed coating film was dried in an oven at an internal atmosphere temperature of 80° C. for 2 hours to obtain a laminate in which a radio wave absorbing layer was formed on a peeling film. Next, the peeling film was removed from the obtained laminate to obtain a radio wave absorbing sheet (sheet thickness: 0.31 mm) of Example 1B.

Example 2B

In Example 2B, except that the hexagonal ferrite particles Example 2A (that is, particles 2) were used instead of the hexagonal ferrite particles of Example 1A (that is, particles 1), the same operation as in Example 1B was performed to obtain a radio wave absorbing sheet (sheet thickness: 0.29 mm) of Example 2B.

Example 3B

In Example 3B, except that the hexagonal ferrite particles Example 3A (that is, particles 3) were used instead of the hexagonal ferrite particles of Example 1A (that is, particles 1), the same operation as in Example 1B was performed to obtain a radio wave absorbing sheet (sheet thickness: 0.31 mm) of Example 3B.

Example 4B

In Example 4B, except that the hexagonal ferrite particles Example 8A (that is, particles 8) were used instead of the hexagonal ferrite particles of Example 1A (that is, particles 1), the same operation as in Example 1B was performed to obtain a radio wave absorbing sheet (sheet thickness: 0.31 mm) of Example 4B.

Example 5B

In Example 5B, except that the hexagonal ferrite particles Example 10A (that is, particles 10) were used instead of the hexagonal ferrite particles of Example 1A (that is, particles 1), the same operation as in Example 1B was performed to obtain a radio wave absorbing sheet (sheet thickness: 0.38 mm) of Example 5B.

Comparative Example 1B

In Comparative Example 1B, except that the hexagonal ferrite particles Comparative Example 3A (that is, particles 18) were used instead of the hexagonal ferrite particles of Example 1A (that is, particles 1), the same operation as in Example 1B was performed to obtain a radio wave absorbing sheet (sheet thickness: 0.28 mm) of Comparative Example 1B.

Comparative Example 2B

In Comparative Example 2B, except that the hexagonal ferrite particles Comparative Example 4A (that is, particles 19) were used instead of the hexagonal ferrite particles of Example 1A (that is, particles 1), the same operation as in Example 1B was performed to obtain a radio wave absorbing sheet (sheet thickness: 0.27 mm) of Comparative Example 2B.

Measurement

1. With respect to Examples 1B to 5B, Comparative Example 1B, and Comparative Example 2B produced as described above, the S parameter at an incidence angle of 0° was measured in a range of 48 GHz to 93 GHz by a free space method. Then, from the measured S parameter, magnetic permeability [$\mu''$ peak frequency (unit: GHz) and $\mu''$ peak value] of an imaginary part were calculated using the Nicholson-Loss model method.

The device used was a network analyzer manufactured by Agilent Technologies. The results are shown in Tables 7 and 8.

The $\mu''$ peak frequency is preferably equal to or higher than 60 GHz, more preferably equal to or higher than 70 GHz, and even more preferably equal to or higher than 80 GHz. In addition, the peak value is preferably equal to or higher than 0.2, more preferably equal to or higher than 0.3, and even more preferably equal to or higher than 0.4.

value), and showed deteriorated performance of the radio wave absorber, compared to the radio wave absorbing sheets of Examples 1B to 5B.

Production of Radio Wave Absorber (2)

Example 6B

Figure 2:
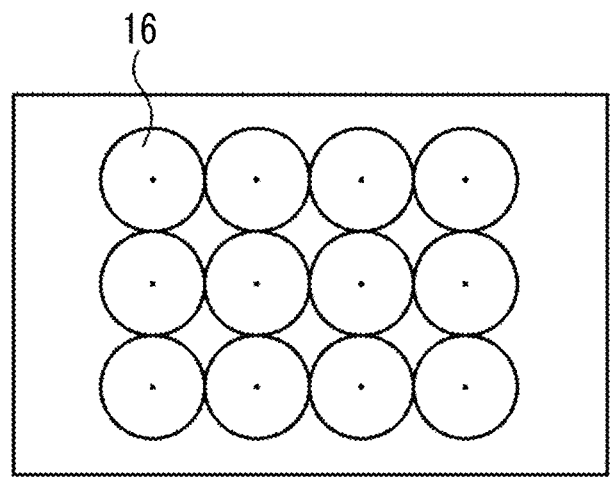
FIG. 2 is a plan view of the radio wave absorber of Example 6B.
Figure 3:
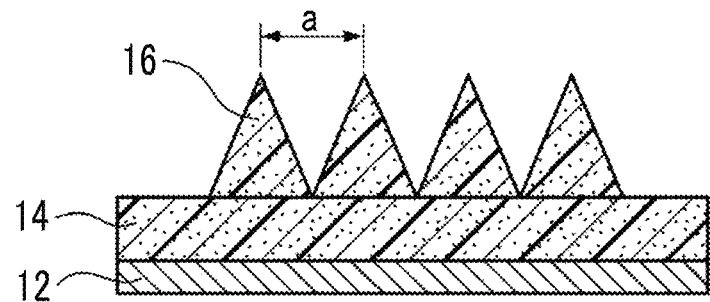
FIG. 3 is a schematic cross-sectional view of the radio wave absorber of Example 6B.

A radio wave absorber 10 having a three-dimensional structure shown in FIGS. 1 to 3 was produced by the following method. FIG. 1 is a perspective view of the produced radio wave absorber, FIG. 2 is a plan view thereof, and FIG. 3 is a schematic cross-sectional view thereof. In each of the drawings, components denoted by the same reference numerals mean the same components.

9.0 g of the hexagonal ferrite particles of Example 5A (that is, particles 5), 1.05 g of acrylonitrile-butadiene rubber (NBR) (grade: JSR N215SL, JSR Corporation, binder), and 6.1 g of cyclohexanone were stirred and mixed with a stirring device [Product name: Awatori Neritaro ARE-310, Shinky Co., Ltd.], at a rotation speed of 2,000 rpm for 5 minutes to prepare a first radio wave absorbing layer formation composition. Next, the prepared first radio wave absorbing layer formation composition was applied on an aluminum plate (thickness: 0.1 mm) as a support 12 using an applicator to form a coating film. Next, the formed coating film was dried in an oven at an internal atmosphere temperature of 80° C. for 2 hours to obtain a radio wave absorbing sheet (thickness: 0.4 mm) in which a first radio wave absorbing layer 14 was formed on the support 12.

Next, 100 g of the hexagonal ferrite particles of Example 5A (that is, particles 5), 11.7 g of acrylonitrile-butadiene rubber (NBR) (grade: JSR N215SL, JSR Corporation, binder), and 34.8 g of methyl ethyl ketone were stirred and

TABLE 7

| | | Example 1B | Example 2B | Example 3B | Example 4B | Example 5B |
|---|---|---|---|---|---|---|
| Kind of particles | | Particles 1 | Particles 2 | Particles 3 | Particles 8 | Particles 10 |
| Thickness of sheet [mm] | | 0.31 | 0.29 | 0.31 | 0.31 | 0.38 |
| Magnetic permeability (imaginary part) | $\mu''$ peak frequency [GHz] | 82.2 | 85.6 | 86.9 | 63.2 | 80.2 |
| | $\mu''$ peak value | 0.80 | 1.01 | 0.81 | 0.40 | 0.50 |

TABLE 8

| | | Comparative Example 1B | Comparative Example 2B |
|---|---|---|---|
| Kind of particles | | Particles 18 | Particles 19 |
| Thickness of sheet [mm] | | 0.28 | 0.27 |
| Magnetic permeability (imaginary part) | $\mu''$ peak frequency [GHz] | 73.0 | 75.0 |
| | $\mu''$ peak value | <0.05 | <0.05 |

As shown in Table 7, the radio wave absorbing sheets of Examples 1B to 5B which are the radio wave absorbers containing the hexagonal ferrite particles of Examples 1A to 3A, Example 8A, and Example 10A (that is, particles 1 to 3, particle 8, and particle 10) exhibited excellent radio wave absorbing performance in a high frequency band.

On the other hand, as shown in Table 8, the radio wave absorbing sheets of Comparative Examples 1B and 2B which are the radio wave absorbers containing the hexagonal ferrite particles of Comparative Examples 3A and 4A (that is, particles 18 and 19) showed a low value of the imaginary part (loss) of magnetic permeability ($\mu''$ peak mixed with a stirring device [Product name: Awatori Neritaro ARE-310, Shinky Co., Ltd.], at a rotation speed of 2,000 rpm for 5 minutes to prepare a second radio wave absorbing layer formation composition. Next, a syringe having an inner diameter of the ejection nozzle of 0.5 mm was filled with the prepared second radio wave absorbing layer formation composition. Then, the filled second radio wave absorbing layer formation composition was started to be ejected onto a surface of the first radio wave absorbing layer 14 of the radio wave absorbing sheet prepared above in a state where a nozzle tip approached on the surface of the first radio wave absorbing layer 14, the nozzle tip was moved in a direction separating from the surface of the first radio wave absorbing layer 14, the ejection of the second radio wave absorbing layer formation composition was stopped, and accordingly, a protrusion having a conical shape having a height of 7 mm was formed. Then, the protrusions having a conical shape were formed so as to be arranged vertically and horizontally at an interval a of 3 mm (that is, distance between the tops of adjacent protrusions having a conical shape). Next, by drying in an oven at an internal atmosphere temperature of 80° C. for 1 hour, the radio wave absorber 10 having a three-dimensional structure was obtained.

As shown in FIG. 1, the produced radio wave absorber 10 includes the support 12 and the first radio wave absorbing layer 14 having a flat plate shape on a surface of the support 12. A second radio wave absorbing layer 16 erected on the surface of the first radio wave absorbing layer 14 and having a conical shape, the outer peripheral portions on the bottom surface of which are in contact with each other, are further provided on the first radio wave absorbing layer 14. In the produced radio wave absorber 10, the protrusions having a conical shape are provided in parallel in the longitudinal direction and the width direction.

The contents of JP2017-252035 filed on Dec. 27, 2017 are incorporated herein by reference.

All of the documents, the patent applications, and the technology standards described here are incorporated here by reference.

What is claimed is:

1. Particles of a magnetoplumbite-type hexagonal ferrite represented by Formula (1) and having a single crystal phase, $$AFe_{(12-x)}Al_xO_{19} \quad \text{Formula (1)}$$

in Formula (1), A represents at least one metal element selected from the group consisting of Sr, Ba, Ca, and Pb, and x satisfies $1.5 \leq x \leq 8.0$, wherein a number average particle diameter D50 of the particles of the magnetoplumbite-type hexagonal ferrite is 2 μm or more and 100 μm or less, and wherein a μ" peak frequency of the particles of the magnetoplumbite-type hexagonal ferrite is equal to or higher than 60 GHz, and a μ" peak value of the particles of the magnetoplumbite-type hexagonal ferrite is equal to or higher than 0.2.

2. The particles of a magnetoplumbite-type hexagonal ferrite according to claim 1, wherein x in Formula (1) satisfies $1.5 \leq x \leq 6.0$.

3. The particles of a magnetoplumbite-type hexagonal ferrite according to claim 1, wherein the magnetoplumbite-type hexagonal ferrite particles are used for a radio wave absorber.

4. A method for producing the particles of a magnetoplumbite-type hexagonal ferrite according to claim 1, the method comprising:

a step A of obtaining a precipitate containing Fe, Al, and the at least one metal element selected from the group consisting of Sr, Ba, Ca, and Pb by a liquid phase method; and a step B of firing the precipitate obtained in the step A.

5. The method for producing the particles of a magnetoplumbite-type hexagonal ferrite according to claim 4, wherein the step A includes a step of mixing an aqueous solution containing an Fe salt, an Al salt, and a salt of the at least one metal element with an alkali aqueous solution to obtain a reaction product.

6. A radio wave absorber having a planar shape, comprising:

the particles of a magnetoplumbite-type hexagonal ferrite according to claim 1; and a binder.

7. A radio wave absorber having a three-dimensional shape, comprising:

the particles of a magnetoplumbite-type hexagonal ferrite according to claim 1; and a binder.

* * * * *